US011056646B2

(12) United States Patent
Ramsbey et al.

(10) Patent No.: US 11,056,646 B2
(45) Date of Patent: Jul. 6, 2021

(54) MEMORY DEVICE HAVING PROGRAMMABLE IMPEDANCE ELEMENTS WITH A COMMON CONDUCTOR FORMED BELOW BIT LINES

(71) Applicant: Adesto Technologies Corporation, Santa Clara, CA (US)

(72) Inventors: Mark T. Ramsbey, Sunnyvale, CA (US); Venkatesh P. Gopinath, Fremont, CA (US); Jeffrey Allan Shields, Sunnyvale, CA (US); Kuei Chang Tsai, Cupertino, CA (US); Chakravarthy Gopalan, Santa Clara, CA (US); Michael A. Van Buskirk, Saratoga, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/746,420

(22) PCT Filed: Jul. 20, 2016

(86) PCT No.: PCT/US2016/043080
§ 371 (c)(1),
(2) Date: Jan. 21, 2018

(87) PCT Pub. No.: WO2017/015333
PCT Pub. Date: Jan. 26, 2017

(65) Prior Publication Data
US 2018/0205012 A1    Jul. 19, 2018

Related U.S. Application Data

(60) Provisional application No. 62/194,996, filed on Jul. 21, 2015.

(51) Int. Cl.
*H01L 45/00* (2006.01)
*G11C 13/00* (2006.01)
(Continued)

(52) U.S. Cl.
CPC ........ *H01L 45/085* (2013.01); *G11C 13/0011* (2013.01); *H01L 23/528* (2013.01);
(Continued)

(58) Field of Classification Search
CPC . H01L 45/085; H01L 23/5226; H01L 23/528; H01L 45/1253; H01L 45/1233;
(Continued)

(56) References Cited

U.S. PATENT DOCUMENTS

7,251,152 B2    7/2007    Roehr
7,440,303 B2    10/2008   Liaw
(Continued)

*Primary Examiner* — Latanya N Crawford Eason (57) ABSTRACT

An integrated circuit device can include a plurality of access transistors formed in a substrate having control terminals connected to word lines that extend in a first direction; a plurality of two-terminal programmable impedance elements formed over the substrate; at least one conductive plate structure formed on and having a common conductive connection to, the programmable impedance elements, and extending in at least the first direction; a plurality of storage contacts that extend from a first current terminal of each access transistor to one of the programmable impedance elements; a plurality of bit lines formed over the at least one conductive plate structure, the bit lines extending in a second direction different from the first direction; and a plurality of bit line contacts that extend from a second current terminal of each access transistor through openings in the at least one plate structure to one of the bit lines.

17 Claims, 6 Drawing Sheets

(51) Int. Cl.
*H01L 27/24* (2006.01)
*H01L 23/522* (2006.01)
*H01L 23/528* (2006.01)

(52) U.S. Cl.
CPC ...... *H01L 23/5226* (2013.01); *H01L 27/2436* (2013.01); *H01L 45/04* (2013.01); *H01L 45/08* (2013.01); *H01L 45/1233* (2013.01); *H01L 45/1253* (2013.01); *G11C 13/0028* (2013.01); *G11C 2213/71* (2013.01); *G11C 2213/79* (2013.01)

(58) Field of Classification Search
CPC ............. H01L 27/2436; G11C 13/0011; G11C 13/0028; G11C 2213/79
See application file for complete search history.

(56) References Cited

U.S. PATENT DOCUMENTS

| | | | |
|---|---|---|---|
| 8,107,273 B1 | 1/2012 | Hollmer et al. | |
| 8,274,842 B1 | 9/2012 | Hollmer et al. | |
| 8,294,488 B1 | 10/2012 | Derhacobian et al. | |
| 8,687,403 B1 | 4/2014 | Derhacobian et al. | |
| 2006/0050547 A1* | 3/2006 | Liaw | G11C 13/0011 365/148 |
| 2009/0140386 A1* | 6/2009 | Inoue | H01L 27/10811 257/532 |
| 2010/0103722 A1* | 4/2010 | Nirschl | G11C 13/0004 365/163 |
| 2010/0264394 A1 | 10/2010 | Aozasa | |
| 2010/0265757 A1 | 10/2010 | Otsuka | |

* cited by examiner

FIG. 12B

MEMORY DEVICE HAVING PROGRAMMABLE IMPEDANCE ELEMENTS WITH A COMMON CONDUCTOR FORMED BELOW BIT LINES

TECHNICAL FIELD

The present disclosure relates generally to integrated circuits (ICs) that include programmable impedance elements, and more particularly to ICs having such elements connected to a common conductor (e.g., a plate structure) formed below bit lines.

BACKGROUND

Conventional resistive random access memory (RRAM) devices, such as CBRAM type devices, can include two terminal storage elements that are programmable between different resistance values. Some conventional CBRAM devices can have memory elements that have one terminal (i.e., anode or cathode) commonly connected to one another by way of a conductive layer, sometimes referred to as a plate. Conventional CBRAM devices typically form memory elements near the end of the fabrication process. In particular, such elements are formed following the formation of metallization layers, including those that form bit lines. As a result, conventional CBRAM type devices typically include a plate that is formed over bit lines.

DISCLOSURE OF INVENTION

An integrated circuit device can include access transistors formed in a substrate. A plurality of two-terminal programmable impedance elements can be formed over the substrate. One or more conductive plate structures can be formed that have a common conductive connection to the programmable impedance elements. The plate structure(s) can extend in at least a first direction. A plurality of storage contacts can extend vertically from each access transistor to one of the programmable impedance elements. Bit lines can be formed over the plate structure(s). The bit lines can extend in a second direction that is different than the first (word line) direction. Bit line contacts can extend vertically from each access transistor through openings in plate structure(s) to one of the bit lines.

An IC device can include access transistors formed in a substrate that are connected to word lines. Word lines can extend in a first direction. Two-terminal programmable impedance elements can be formed over the substrate and arranged into groups. Conductive plate structures can be formed that have a common conductive connection to different groups of the programmable impedance elements. Each conductive plate structure can extend in the first direction. Storage contacts can extend vertically from each access transistor to one of the programmable impedance elements. Bit lines can be formed over the plate structures that extend in a second direction. Bit line contacts can extend vertically from each access transistor through openings in the plate structures to the bit lines.

An IC device can include bit lines extending in a first direction. One or more conductive plate structures can be formed between the bit lines and a substrate of the IC device. The plate structures can extend in a second direction. Two-terminal programmable impedance elements can have a common conductive connection to the plate structure(s). Access transistors can be formed in the substrate and have control terminals connected to word lines that extend in the second direction. Bit line contacts can extend vertically from one of the bit lines through an opening in plate structure(s) to the access transistors. Storage contacts can extend vertically from a corresponding programmable impedance element to the access transistors.

DETAILED DESCRIPTION OF THE EMBODIMENTS

Embodiments can include a memory device having memory cells that each include an access transistor and one or more programmable impedance storage elements. The storage elements can be commonly connected to a plate conductor that is formed below bit lines. Bit lines can be connected to the memory cells by bit line contacts that extend through openings in the plate conductor(s). Access transistors can have gates commonly connected to word lines, which can extend in a first direction. The plate conductor can also extend in the first direction. In this way, programmable impedance elements can be incorporated into an integrated circuit device at some level below a metallization layer, including below a first metallization layer.

In the various embodiments below, like items are referred to by the same reference character but with the leading digit(s) corresponding to the figure number.

Figure 1:
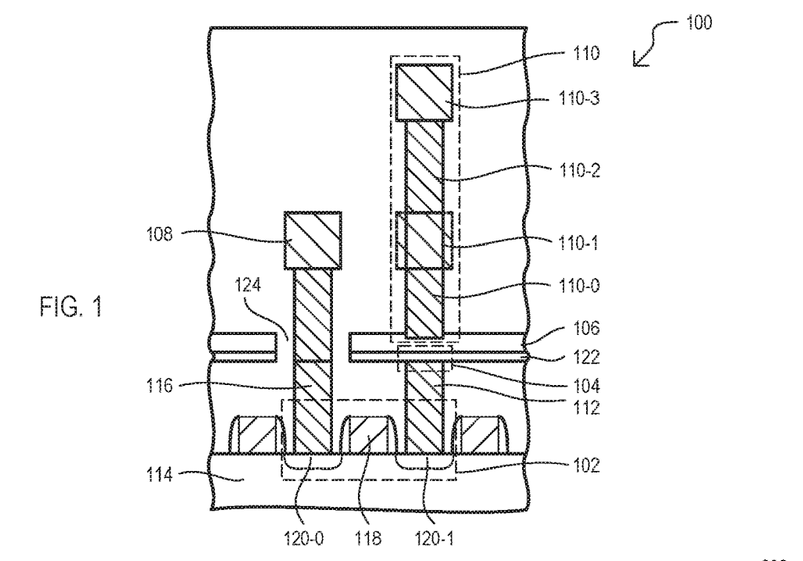
FIG. 1 is a side cross sectional view of integrated circuit (IC) devices according to embodiments.

FIG. 1 is a side cross sectional view of an integrated circuit device 100 according to one embodiment. An IC device 100 can include access device (one shown as 102), a programmable impedance storage element 104, a conductive plate structure 106, bit lines (one shown as 108), and a plate tap structure 110. A storage contact 112 can extend vertically from a substrate 114 to a storage element 104. A bit line contact 116 can extend vertically from a substrate 114 to a bit line 108.

An access device 102 can be any suitable circuit element that can be controlled to enable current to flow through corresponding storage element 104. As but a few, non-limiting examples, an access device 102 can include a diode type device, thyristor type device, or a transistor. In the particular embodiment shown, an access device is an access transistor 102. An access transistor 102 can be any suitable transistor that enables a current path in response to a signal at a control terminal. In the particular embodiment shown, an access transistor 102 can be an insulated gate field effect transistor, referred to herein as a metal-oxide-semiconductor (MOS) transistor, but not being limited to any particular gate insulator. Access transistors 102 can have control terminals 118 (i.e., gates) connected in a conductive fashion to word lines. In some embodiments, word lines can be contiguous structures that integrally include the control terminal of access transistors. Word lines can be elongated structures that generally extend in one direction (e.g., into and out of the page in the view of FIG. 1). Access transistors can include a first current terminal (e.g., source/drain) 120-0 and a second current terminal (e.g., drain/source) 120-1 through which current can flow by operation of the control terminal 118. In the embodiment shown, one current terminal 120-0 can be shared with an adjacent access transistor. However, other embodiments can include access transistors that do not share a source or drain with another access transistor A storage contact 112 can provide a conductive connection between a second current terminal 120-1 and the corresponding storage element 104. A storage contact can include a single conductive structure (e.g., contact), or can include multiple conductive structures stacked on top of one another (e.g., a contact with a via, or a metallization landing pad, etc.). A storage contact 112 can be formed in an opening created in one or more insulating layers.

A storage element 104 can be a two-terminal element that can be programmed between two or more impedance states to store a data value. In some embodiments, a storage element 104 can be programmable by application of electric fields. In the embodiment shown, a storage element 104 can include a memory layer 122 that is programmable between different impedance states by an oxidation-reduction reaction induced by application of electric fields. In one very particular embodiment, storage elements can be CBRAM type memory elements. A memory layer 122 can include multiple sub-layers (e.g., formed by a stack of different layers). Further, a memory layer 122 (or any of its sub-layers) can be a contiguous layer common to multiple storage elements, or can be a layer (or sub-layer) distinct to each storage element. Still further, while FIG. 1 shows memory layer 122 as a flat, contiguous layer, in alternate embodiments all or a portion of a memory layer (or sub-layer) can reside in an opening shared with a storage contact 112. That is, all or a portion of a storage element 104 can be formed in a contact opening, or similar type opening.

A plate structure 106 can extend over and be conductively connected to, or form part of, a number of storage elements 104. In some embodiments, a plate structure 106 serves as, or is conductively connected to, one terminal of each storage element 104. It is understood that an IC device can include multiple plate structures 106 corresponding to different groups of storage elements, with each plate structure being capable of being separately driven between two or more plate voltages. Thus, in an access operation of the IC device, one plate could be driven to one voltage while another plate is driven (or maintained) at a different voltage. A plate structure 106 can extend in a same direction as word lines (e.g., into and out of the page in the view of FIG. 1). A plate structure 106 can be composed of a single conductive layer, or can include a number of conductive sub-layers.

Referring still to FIG. 1, an IC device can include plate openings 124 which can be conceptualized as extending through a plate structure 106 or as existing between adjacent plate structures 106.

A plate tap structure 110 can bias a plate structure 106 to any of a number of different voltages. A plate tap structure 110 can take any suitable form that provides a conductive connection between a voltage driving circuit and the plate structure 106. Some particular but non-limiting examples are shown in FIG. 1. In some embodiments, a plate tap conductor 110 can include only a first tap conductor 110-0 in direct contact with plate structure 106. First tap conductor 110-0 can be patterned from one or more metallization layers, such as layers that form other interconnections in an IC device 100. In a particular embodiment, first tap conductor 110-0 can be formed from the same metallization layer(s) that form bit lines in an IC device.

In other embodiments, a plate tap structure 110 can include multiple tap conductors. For example, in some embodiments, plate tap structure 110 can include a first tap conductor 110-0 and a second tap conductor 110-1. In such an arrangement, a first tap conductor 110-0 can be contact structure (e.g., via) that extends from a plate structure 106 to second tap conductor 110-1, which can be formed from one or more metallization layers, including those used to form bit lines 108. In still other embodiments, a plate tap structure 110 can extend above a vertical level of a bit line 108, including any of multiple tap conductors (e.g., any of 110-0/1/2/3) or one large conductive structure.

In this way, a plate tap structure can be at a vertical level that is lower than the bit lines, the same as the bit lines, or higher than the bit lines.

A bit line contact 116 can provide a conductive connection between a first current terminal 120-0 and a bit line 108. As in the case of the storage contact, a bit line contact 116 can include a single conductive structure or multiple conductive structures stacked on top of one another. Bit line contact 116 extends through a plate opening 124. It is understood that one bit line contact can be shared by multiple adjacent access transistors 102.

A bit line 108 can be patterned from one or more metallization layers formed over a plate structure 106. In some embodiments, bit lines 108 can be elongated structures that extend in a different direction than word lines. In particular embodiments, bit lines 108 can be generally perpendicular to word lines (e.g., horizontally in the view of FIG. 1). Bit lines 108 can be positioned at a higher vertical level than the plate structure(s) 106. While bit line 108 is shown at a particular vertical level in FIG. 1, it is understood that a bit line 108 can be formed at a higher vertical level (i.e., above a plate structure 106). In some embodiments, bit lines 108 can be formed from a "metal 1" (M1) layer (a first metallization layer formed in a fabrication process). However, in other embodiments bit lines can be formed from any other higher vertical level conductive layer. Said in another way, a plate structure 106 can be below any other conductive/metallization layer as long as the bit lines 108 are above the plate structure 106.

In this way, an IC device can include a plate structure that extends in a word line direction, and is positioned between bit lines and a substrate, with bit line contacts extending through plate openings from bit lines to the substrate.

Figure 2A:
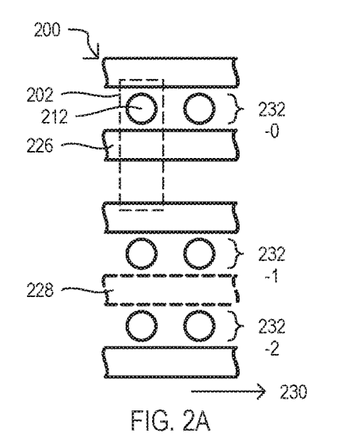
FIGS. 2A to 2C are plan views of an IC device according to an embodiment.
Figure 2B:
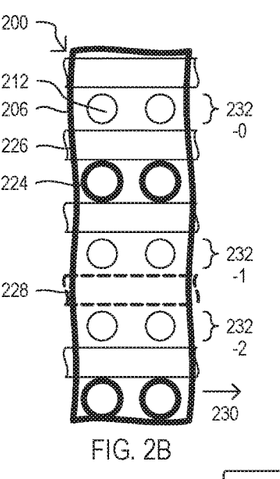
Figure 2C:
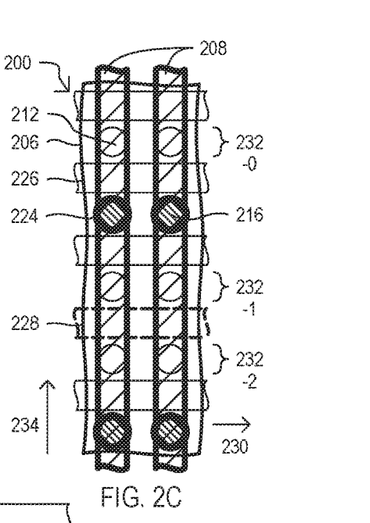

FIGS. 2A to 2C are a sequence of top plan views of an IC device 200 according to another embodiment. FIG. 2A shows the formation of word lines (one shown as 226) on a substrate surface. Word lines 226 can integrally include, or be conductively connected to, control terminals of multiple access transistors. One possible position of an access transistor is shown by 202. Word lines 226 can be elongated structures that extend in a first direction, shown by arrow 230. Storage contacts (one shown as 212) can be formed adjacent to word lines, and can be conceptualized as being organized into storage contact groups 232-0/1/2 that extend in first direction 230. Storage contact groups 232-0/1/2 can be conceptualized as being different rows of storage contacts.

Optionally, an IC device 200 can include other extra word lines 228 that serve as dummy word lines, or isolation word lines. A dummy word line may not be biased and can be situated over an isolation structure formed in a substrate. An isolation word line can be biased to electrically isolate adjacent storage contacts from one another. Other embodiments may not include extra word lines 228 and may optionally have substrate isolation structures.

FIG. 2B shows the formation of a plate structure 206 over word lines 226. It is understood that a memory layer may have been previously formed below plate structure 206 to create storage elements at the location of storage contacts 212. Plate structure 206 can have plate openings (one shown as 224) formed therein. In the particular embodiment of FIG. 2B, plate openings 224 can be formed at the future locations of bit line contacts. While openings 224 have a circular shape, embodiments can include any suitable shape. Plate structure 206 can extend in the first direction 230 over storage contact groups 232-0/1/2. Further, in some embodiments, a plate structure 206 can also extend in a second direction different from the first direction (i.e., in a direction perpendicular to direction 230). An IC device 200 can include multiples of such plate structures that are separately biasable.

FIG. 2C shows the formation of bit line contacts (one shown as 216) that extend through plate openings 224 to a substrate (and hence an access transistor). FIG. 2C also shows the formation of bit lines 208 over plate structure 206 and in contact with bit line contacts 216. Bit lines 208 can have an elongated shape and extend in a second direction shown by arrow 234, which is different than the first direction 230. In the embodiment shown, first direction 230 can be perpendicular to second direction 234. While FIG. 2C shows bit lines 208 that cover only one bit line contact 216 in the word line direction 230, alternate embodiments can include bit lines that cover more than one bit line contact in the word line direction (e.g., bit lines are more than one column wide).

While the embodiment of FIGS. 2A to 2C show a plate structure that can be contiguous over storage contact groups, alternate embodiments can include narrower plate structures that extend over different storage contact groups. Examples of such alternate embodiments are shown in FIGS. 3A and 3B.

Figure 3A:
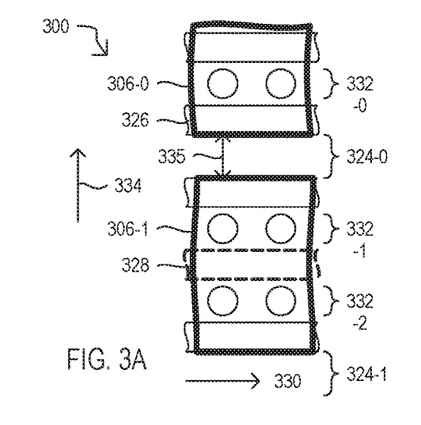
FIGS. 3A and 3B are plan views of an IC device showing alternate plate structures for a bit line contact pattern like that of FIGS. 2A to 2C.

FIG. 3A is a top plan view of an IC device 300 according to an embodiment and shows the formation of a plate structures 306-0/1 over word lines and storage contacts like those shown in FIG. 2A. Plate structures 306-0/1 can each be formed over two groups (e.g., rows) of storage contacts. In particular, plate structure 306-0 can be formed over storage contact row 332-0 (and another row not shown), while plate structure 306-1 can be formed over storage contact rows 332-1/2. Regions between adjacent plate structures 306-0/1 can be plate openings 324-0/1. Plate structures 306-0/1 can be separately biased. Bit lines can be formed over the structure, such as shown in FIG. 2C, as but one example. FIG. 3A shows a width of a plate opening 335 in a bit line direction 334. According to embodiments, a narrowest width of a plate opening can be no more than twice a width of a bit line contact taken in the same direction.

Figure 3B:
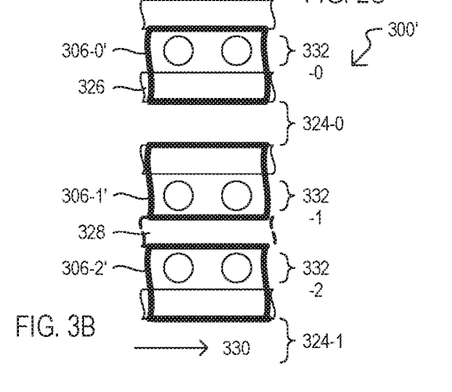

FIG. 3B is a top plan view of an IC device 300' according to another embodiment, and shows the formation of a plate structures 306-0'/1'/2' over word lines and storage contacts as in the case of FIG. 3A. However, unlike FIG. 3A, plate structures 306-0'/1'/2' can be formed over single groups (e.g., rows) of storage contacts. Bit lines can be formed over the structure as shown in FIG. 2C, as but one example.

It is understood that while FIGS. 2A to 3B show word lines and bit lines having generally straight shapes, alternate embodiments can include such structures with different shapes, including zig-zag (e.g., serpentine) shapes as well as wider regions that provide contact landings to enable word lines to be driven to particular voltages.

Figure 4A:
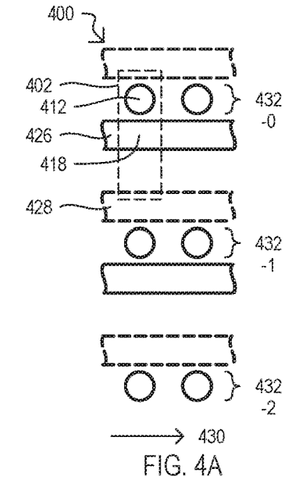
FIGS. 4A to 4C are plan views of an IC device according to another embodiment.
Figure 4B:
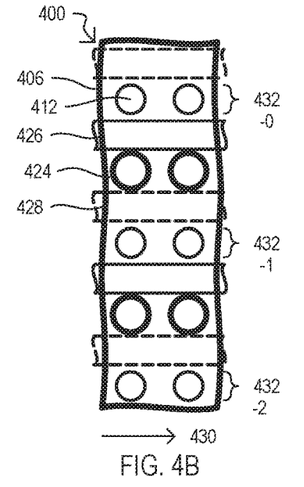
Figure 4C:
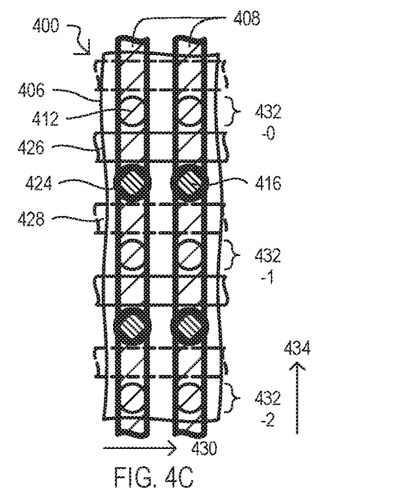

FIGS. 4A to 4C are a sequence of top plan views of an IC device 400 according to another embodiment. The embodiment of FIGS. 4A to 4C shows items like those of FIGS. 2A to 2C, and like items are referred to by the same reference character but with the leading digit being "4" instead of "2".

FIG. 4A differs from that of FIG. 2A in that word lines 426 can have a different arrangement. In the example shown, word lines 426 can alternate with extra word lines 428. However, it is understood that any of the extra word lines can be dummy or isolation word lines as noted in the description of FIG. 2A. In addition or alternatively, there can be isolation structures at the locations of extra word lines.

FIGS. 4B and 4C show structures like those of FIGS. 2B and 2C, respectively.

Figure 5A:
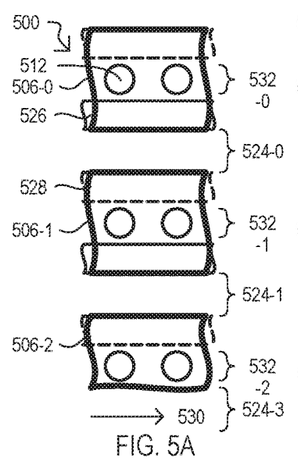
FIGS. 5A and 5B are plan views of an IC device showing alternate plate structures for a bit line contact pattern like that of FIGS. 4A to 4C.
Figure 5B:
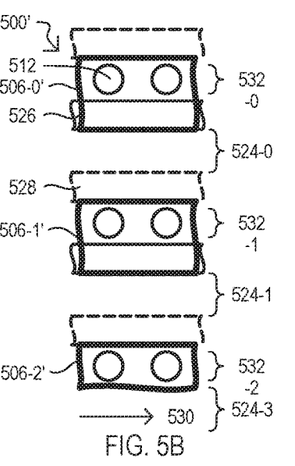

FIGS. 5A and 5B are top plan views that show plate structures (506-0 to -2 and 506-0' to -2') over word lines and storage contacts like those shown in FIG. 4A. While the plate structures are each formed over one group of storage contacts (532-0 to -2), plate structures 506-0 to -2 can each be formed over two word lines, while plate structures 506-0' to -2' can each be formed over one word line. While FIG. 5B shows a plate structure that overlaps only one word line, in other embodiments, a plate structure may overlap no word lines. As but one example, a plate structure can be formed over one group of storage contacts and positioned between word lines when viewed from above.

Figure 6:
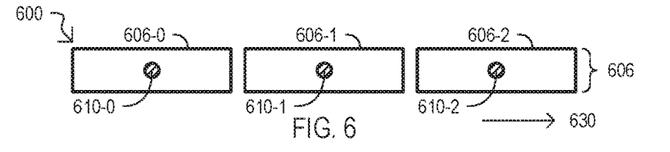
FIG. 6 is a top plan view of a plate structure that can be included in embodiments.

While FIGS. 2A to 5B have shown arrangements that can include an extra word line, alternate embodiments can include no extra word lines and/or no isolation structures. Also, while FIGS. 2A to 5B show particular embodiments with plate structures that are contiguous in a word line direction, it is understood that embodiments can include plate structures formed by multiple elongated plate sections that extend in the word line (e.g., row) direction. FIG. 6 shows one example of such an embodiment.

FIG. 6 is a top plan view of an IC device 600 having a plate structures 606 with multiple plate sections 606-0 to -2 that extend in the row direction 630. Each plate section (606-0 to -2) can extend over one or more sets of storage contact groups and/or word lines as described for plates structures herein, or equivalents. Further, a plate section can have one or more plate tap structures connected thereto to drive the plate section between two or more different plate voltages. The particular embodiment of FIG. 6 shows each plate section (606-0 to -2) with one plate tap structure 610-0 to -2 located at a central location in each plate section (606-0 to -2). However, alternate embodiments can include a plate tap structure at another location of a plate structure and/or there can be multiple plate tap structures per plate section as noted previously.

In some embodiments plate tap structures can contact a plate section/plate structure on a top surface, as shown in FIG. 1, for example. However, in alternate embodiments, a plate tap structure can contact a plate section/plate structure from a bottom surface. One such embodiment is shown in FIG. 7.

Figure 7:
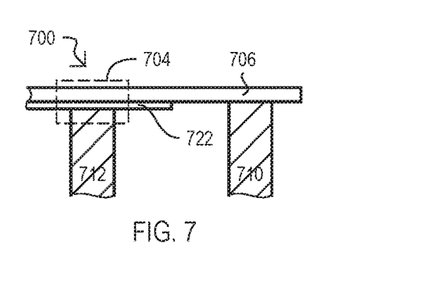
FIG. 7 is a side cross sectional view of a plate tap structure that can be included in embodiments.

FIG. 7 is a side cross sectional view of an IC device 700 having a storage contact 712 that can extend up from a substrate (or other lower structure) to a storage element 704 that includes one or more memory layers 722 which can be connected directly, or indirectly to a plate structure 706. A plate tap structure 710 can extend upward from a substrate (or other lower structure) and have a conductive connection to plate structure 706. Plate structure 706 can be driven between two or more different plate voltages via plate tap structure 710 as described herein, or in an equivalent fashion.

According to some embodiments, IC devices can include plates structures formed below bit lines that can be driven to different plate voltages. In particular embodiments, plate structures can be decoded based on address data and/or mode data. Address data can identify memory cell(s) to be accessed in an operation. Mode data can identify an operation being executed by an IC device when accessing the memory cells. Thus, mode data can identify operations that include, but are not limited to, read or impedance setting operations. Impedance setting operations can include those that set memory elements to particular impedance states, including but not limited to "program" and "erase", including both individual and/or group erase operations.

Figure 8:
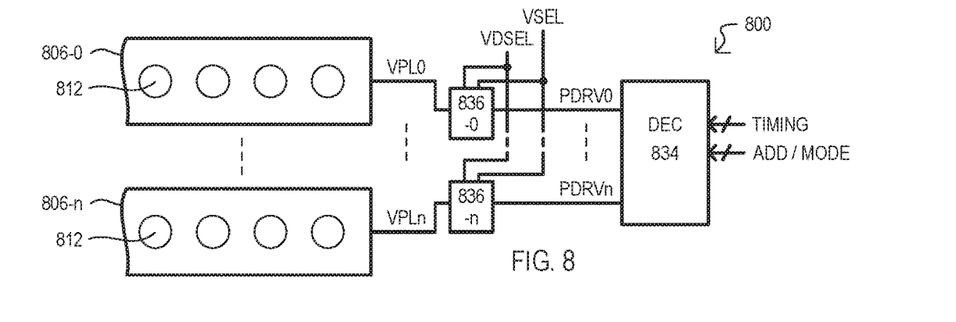
FIG. 8 is a block schematic diagram of a plate decoding arrangement that can be included in embodiments.

FIG. 8 is a diagram showing an IC device 800 having decoded plate structures according to an embodiment. An IC device 800 can include a number of plate structures 806-0 to -n, each of each of which can include a storage element formed at a location of a storage contact (two shown as 812) as described herein, or equivalents.

IC device 800 can further include plate decoder circuit 834 and a number of plate driver circuits 836-0 to -n. A plate decoder circuit 834 can receive address and/or mode signals (ADD/MODE) and, optionally, timing signals (TIMING). From such signals a plate decoder circuit 834 can generate plate drive signals (PDRV0 to PDRVn) that can determine to which voltage a plate structure can be driven. Plate driver circuits 836-0 to -n can each receive corresponding plate driver signals (PDRV0 to PDRVn), and in response, drive its corresponding plate structure (806-0 to -n) to a plate voltage VPL0 to VPLn. In the particular embodiment shown, each plate driver circuit (836-0 to -n) can drive its plate to a selection voltage (VSEL) or deselection voltage (VDSEL). However, alternate embodiments can include more than two possible plate voltages. As but one example, embodiments can include different selection and/or deselection voltages based on the particular operation being executed (e.g., read selection/deselection is different than program selection/deselection).

Figure 9A:
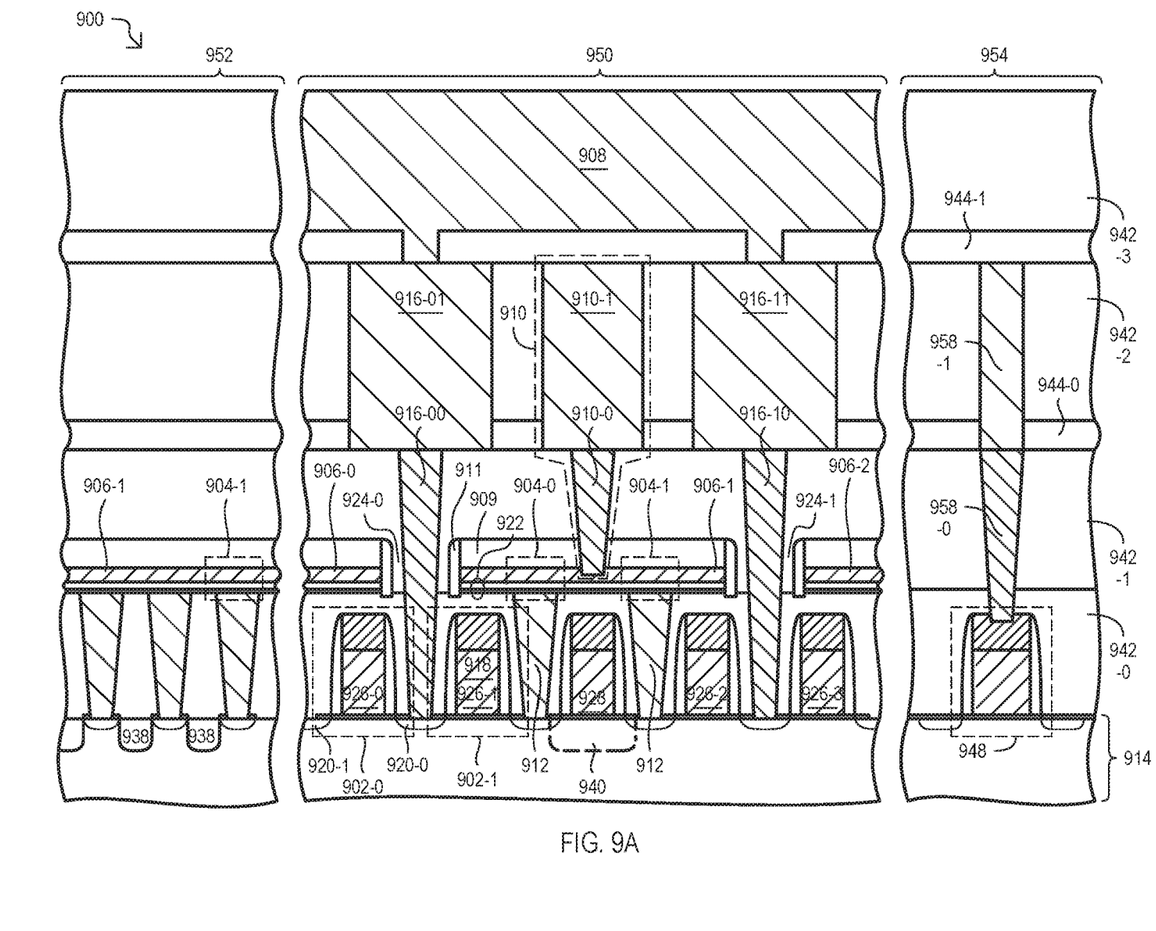
FIGS. 9A and 9B are diagrams showing an IC device according to a particular embodiment.
Figure 9B:
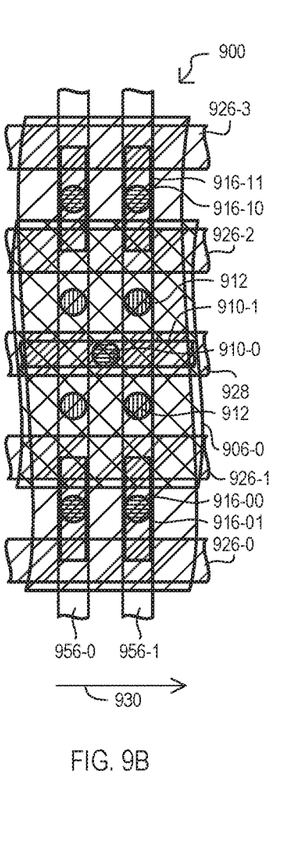

FIGS. 9A and 9B are diagrams showing an IC device 900 according to one particular embodiment. An IC device 900 can include memory cells with access transistors and programmable impedance storage elements, where such storage elements can be conductively connected to a common plate structure that is formed below bit lines.

FIG. 9A shows three cross sectional views of an IC device 900. View 950 is taken along a direction perpendicular to word lines (e.g., a column direction) within a memory array of IC device 900. View 952 is taken along a direction parallel to word lines (e.g., a row direction), through a group of storage contacts within a memory array of IC device 900. View 954 is taken within a location outside of a memory of IC device 900 (e.g., a periphery, or other circuit section of the IC device 900). FIG. 9B is a top plan view of the IC device 900.

Referring to FIG. 9A, an IC device 900 can include access devices (two shown as 902-0/1) formed on and in a substrate 914. In the embodiment shown, access devices 902-0/1 are MOS type transistors, having a control terminal (gates, one shown as 918) as well as current terminals 920-0/1 (sources/drains). Access devices 902-0/1 can be connected to storage elements (two shown as 904-0/1) by storage contacts 912. Storage elements 904-0/1 can include a memory layer 922 disposed between a storage contact and a plate structure 906-1. A memory layer 922 can be formed of multiple sub-layers. In the embodiment shown, an extra word line 928 (or dummy word line) can be formed between adjacent word lines 926-1/2. In addition or alternatively, row isolation 940 can be formed between adjacent word lines 926-1/2 in the substrate 914.

In the embodiment of FIG. 9A, each plate structure 906-0/1/2 can be formed over two word lines 926-1/2 (and a dummy word line 928), and can extend in the word line direction (i.e., into and out of the page in the view of 950). Plate openings 924-0/1 can separate adjacent plate structure from another in a lateral direction (direction parallel to a substrate surface). In FIG. 9A, a plate structure 906-1 can be biased between two or more plate voltages by way of a plate tap structure 910. In the particular embodiment shown, plate tap structure 910 can include a first plate contact structure 910-0 and a second plate contact structure 910-1. As shown in the view of FIG. 9B, second plate contact structure 910-1 can be an elongated structure that extends in the word line direction 930. As in the case of bit line contacts, in alternate embodiments a plate tap structure can be formed by one contact structure. In the embodiment of FIG. 9A, a plate structure 906-0/1/2 can be covered on a top surface by a top plate insulator 909, and a plate tap structure 910 can extend through top plate insulator 909 to contact a plate structure 906-0/1/2. Further, FIG. 9A also shows insulating sidewalls 911 on side surfaces of plate structures 906-0/1/2 and memory layer 922.

In the embodiment of FIG. 9A bit line (BL) contacts can be formed by first and second contact structures stacked on top of one another. Thus, a first BL contact (916-00/01) can include a first BL structure 916-00 that extends through an opening 924-0 in plate structures 906-0/1, and a second BL contact structure 916-01 formed on top of the first bit line contact structure 916-00. Similarly, a second BL contact (916-10/11) can include a first BL structure 916-10 that extends through an opening 924-1 in plate structures 906-1/2, and a second BL contact structure 916-11 formed on top of the first bit line contact structure 916-10. In some embodiments, second BL contact structures 916-01/11 can be metallization "landing pads" formed from a metallization pattern. However, in alternate embodiments, bit line contacts can be formed by a single contact structure, or more than two contact structures.

In the embodiment of FIG. 9A, a bit line 908 can be formed over, and in contact with both BL contacts 916-00/01-10/11. That is, bit line 908 can be in contact with two columns of bit line contacts (where such columns extend in a bit line direction perpendicular to word lines). However, in other embodiments there can be one bit line for each column of bit line contacts. It is noted that bit line 908 is not shown in FIG. 9B, and is understood to extend in a direction perpendicular to the word line direction 930 over the various layers shown.

In a particular embodiment, first bit line contact structures 916-00/10 and first plate contact structures 910-0 can have the same physical structure (e.g., formed with the same fabrication process steps) and second bit line contact structures 916-10/11 and second plate contact structures 910-1 can have the same physical structure.

The view 952 taken parallel to the word lines (and through a group of storage contacts 912) shows bit line isolation structures 938 in the substrate 914 that can extend in a bit line direction and define active areas (shown as 956-0/1 in FIG. 9B)

The view 954 taken of a region outside of an array shows a periphery transistor 948 formed in substrate 914. In some embodiments, a periphery transistor 948 can have the same structure as access transistors 902-0/1. However, in alternate embodiments, a periphery transistor 948 can be formed with different fabrication steps than an access transistor 902-0/1. In FIG. 9A, a periphery transistor 948 can be biased by way of a gate bias structure 958-0/1. In the particular embodiment shown, a gate bias structure 958-0/1 can include a first gate contact structure 958-0 and a second gate contact structure 958-1. In a particular embodiment, first and second gate contact structures 958-0/958-1 can have the same structure as first and second bit line contact structures 916-00/01 and 916-10/11, respectively.

FIG. 9A shows various insulation layers for IC device 900. First insulation layer 942-0 can be formed over transistors (902-0/1, 948). Further, storage contacts 912 can be formed through, and plate structure 906-0/1/2 can be formed on, first insulation layer 942-0. Second insulation layer 942-1 can be formed on first insulating layer 942-0. Further, first bit line contact structures 916-00/10 can extend through first and second insulation layers 942-0/1 to contact substrate 914. First gate bias structure 958-1 can extend through first and second insulation layers 942-0/1 to contact a gate of periphery transistor 948. First plate tap contact structure 910-0 can extend through second insulation layer 942-1 to contact plate structure 906-1. A third insulation layer 942-2 can be formed over second insulation layer 942-1. Second bit line contact structures 916-01/11, second plate contact structure 910-1 and second gate bias structure 958-1 can extend through third insulation layer 942-2 to contact first bit line contact structure 916-00/10, first plate contact structure 910-0 and first gate bias structure 958-0, respectively. A fourth insulation layer 942-3 can be formed over third insulation layer 942-2. Bit line 908 can extend through fourth insulation layer to make contact with second bit line contact structures 916-10/11.

In the embodiment shown, an IC device 900 can further include a first intermediate insulation layer 944-0 between second and third insulation layers 942-1/2. In particular embodiments, first intermediate insulation layer 944-0 can serve as an etch stop layer or a hard etch mask to define openings and/or help prepare or condition openings to first bit line structures 916-00/10, first plate tap structures 910-0, and first gate bias structures 958-0. Similarly, a second intermediate insulation layer 944-1 can be formed between third and fourth insulation layers 942-2/3. In particular embodiments, second intermediate insulation layer 944-1 can serve as an etch stop layer or a hard etch mask to define/prepare/condition openings to second bit line structures 916-10/11. It is understood that any of insulation layers 942-0 to -3 and/or 944-0/1 can include multiple sublayers.

Referring to FIG. 9B, first plate tap contact structure 910-0 is shown to be "misaligned" with respect to columns of bit line contacts and storage contacts. However, alternate embodiments can include plate tap contact structures that are aligned with such columns, or as noted elsewhere herein, contacts aligned at a distal end of plate structure and/or contacts that extend upward from a substrate.

In one very particular embodiment, second bit line contact structures 916-01/11, second plate contact structure 910-1, and second gate bias structure 958-1 can be formed with a first metallization layer (M1) of an IC fabrication process, and bit line 908 can be formed from a second metallization layer (M2) of the IC fabrication process. However, such an arrangement should not be construed as limiting.

Figure 10A:
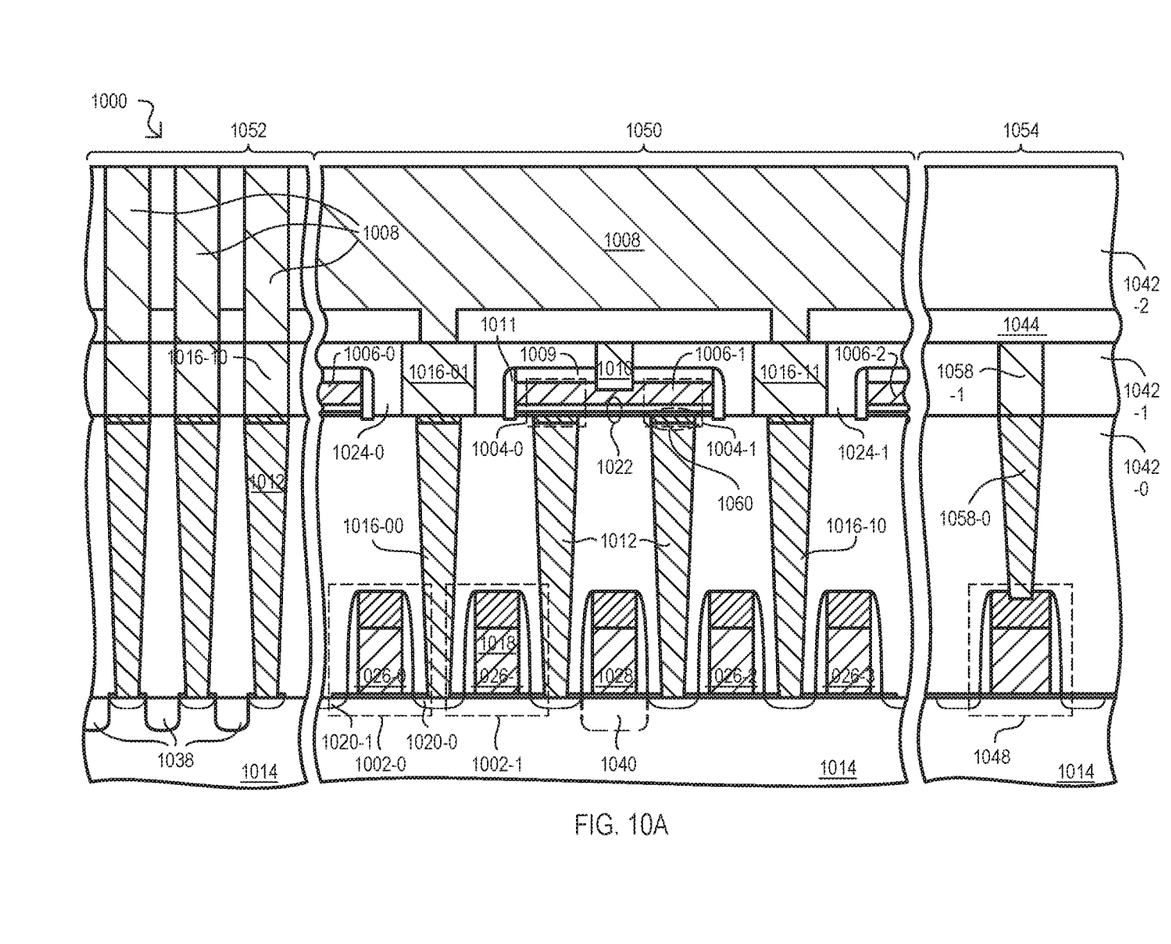
FIGS. 10A and 10B are diagrams showing an IC device according to another particular embodiment.
Figure 10B:
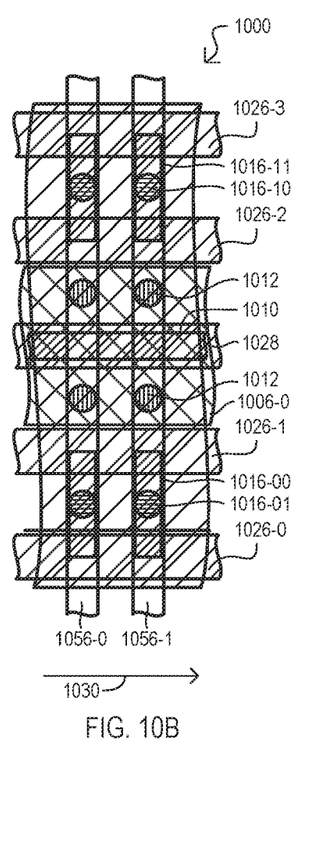

FIGS. 10A and 10B are diagrams showing an IC device 1000 according to another particular embodiment. An IC device 1000 can have a structure like that of FIGS. 9A and 9B.

An IC device 1000 can differ from that of FIGS. 9A/B in that storage contacts 1012 can have the same structure as first bit line contact structures 1016-00/10. Thus, storage contacts 1012 and first bit line contact structures 1016-00/10 can be formed with the same fabrication process steps.

An IC device 1000 can also differ from that of FIGS. 9A/B in that a plate tap structure 1010 can be formed from a single layer (e.g., metallization or other horizontal interconnect layer/pattern). In some embodiments, plate tap structure 1010 can be formed with the same fabrication steps used to form second bit line contact structures 1016-01/11.

An IC device 1000 can further differ from that of FIGS. 9A/B in that storage contacts 1012 (and in the embodiment shown, first bit line contact structures 1016-00/01) can include a modified contact surface (one shown as 1060). A modified contact surface 1060 can be formed by treating a top of a contact structure and/or depositing one or more further layers on the top of a contact structures. In some embodiments, modified contact surface 1060 can form part of a storage element 1004-0/1.

The particular example of FIGS. 10A/B also differs from that of FIGS. 9A/B in that there can be fewer insulating layers. In particular, first insulation layer 1042-0 can be formed over transistors (1002-0/1, 1048). Further, storage contacts 1012 and first bit line contact structures 1016-00/10 can extend through first insulation layers 1042-0 to contact substrate 1014. First gate bias structures 1058-0 can extend through first insulation layer 1042-0 to contact a gate of periphery transistor 1048. A second insulation layer 1042-1 can be formed over first insulation layer 1042-1. Second bit line contact structures 1016-01/11 and second gate bias structure 1058-1 can extend through second insulation layer 1042-1 to contact first bit line contact structure 1016-00/10 and first gate bias structure 1058-0, respectively. Plate tap structure 1010 can extend through second insulation layer 1042-1 to plate structure 1006-1. A third insulation layer 1042-2 can be formed over second insulation layer 1042-1. Bit lines 1008 can extend through third insulating layer to make contact with second bit line contact structures 1016-01/11. In the embodiment shown, an IC device 1000 can further include an intermediate insulation layer 1044 between second and third insulation layers 942-1/2, which can, in particular embodiments, can serve as an etch stop layer or a hard etch mask to define openings and/or help prepare or condition openings to second bit line structures 1016-01/11.

FIG. 10A shows bit lines 1008 in view 1052. It is understood such bit lines 1008 extend in a direction perpendicular to a word line direction.

In one very particular embodiment, second bit line contact structures 1016-01/11, plate tap structure 1010, and second gate bias structure 1058-1 can be formed with a first metallization layer (M1) of an IC fabrication process, and bit lines 1008 can be formed form a second metallization layer (M2) of the IC fabrication process. However, such an arrangement should not be construed as limiting.

Figure 11A:
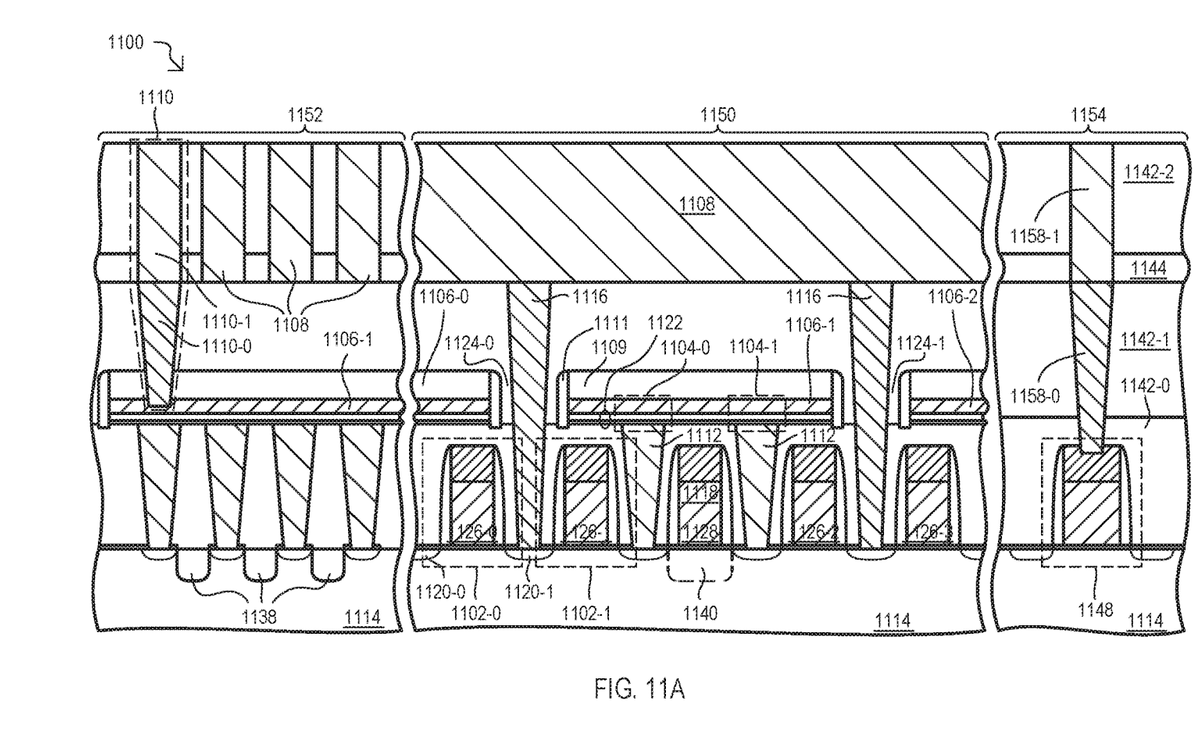
FIGS. 11A and 11B are diagrams showing an IC device according to a further particular embodiment.
Figure 11B:
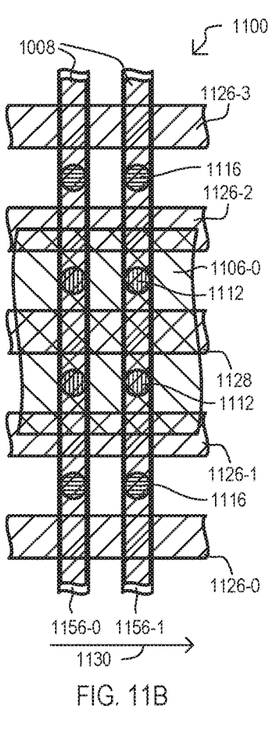

FIGS. 11A and 11B are diagrams showing an IC device 1100 according to another particular embodiment. An IC device 1100 can have a structure like that of FIGS. 9A and 9B.

However, an IC device 1100 can differ from that of FIGS. 9A/B in that bit line contacts 1116 can be unitary structures that extend from a substrate 1114 directly to a bit line 1108. That is, there is no second bit line contact structure (i.e., 916-0/11).

An IC device 1100 can also differ from that of FIGS. 9A/B in that a plate tap structure 1110 can be formed at a distal end of a plate structure. In the embodiment of FIGS. 11A/B view 1152 shows plate tap structure 1110 extending downward to make contact with plate structure 1106-1. Plate tap structure 1110 can include a first plate contact structure 1110-0 and a second plate contact structure 1110-1. In some embodiments, first plate contact structure 1110-0 can be formed with the same process steps that forms bit line contacts 1116. In addition or alternatively, second plate contact structure 1110-1 can be formed with the same process steps that form bit lines 1108. Similarly, outside of an array (view 1154) a first gate bias structure 1158-0 can be formed with the same process steps that forms bit line contacts 1116 and/or a second gate bias structure 1158-1 can be formed with the same process steps that form bit lines 1108.

The particular example of FIGS. 11A/B also differs from that of FIGS. 9A/B in that there can be fewer insulating layers. In particular, storage contacts 1112 can be formed through, and plate structures (1106-0/1/2) can be formed on, a first insulation layer 1142-0. A second insulation layer 1142-1 can be formed over first insulation layer 1142-0. Bit line contacts 1116 can extend from bit line 1108 through first and second insulation layers 1142-0/1, within plate openings 1124-0/1 to contact access transistors 1102-0/1. First gate bias structure 1158-0 can extend through first and second insulation layers 1142-1/2 to contact periphery transistor 1148. First plate contact structure 1110-0 can extend through second insulation layer 1142-1 to contact plate structure 1106-1. A third insulation layer 1142-2 can be formed over second insulation layer 1142-1. Bit lines 1108, second plate contact structure 1110-1, and second gate bias structure 1158-1 extend through third insulation layer 1142-2 to contact bit line contacts 1116, first plate contact structure 1110-0 and first gate bias structure 1158-0, respectively.

FIG. 11A shows bit lines 1108 in view 1152. Further, bit lines 1008 are also shown in FIG. 11B, extending a direction perpendicular to a word line direction 1130.

In one very particular embodiment, bit lines 1108, second plate contact structures 1110-1, and second gate bias structures 1158-1 can be formed with a first metallization layer (M1) of an IC fabrication process. However, such an arrangement should not be construed as limiting.

Figure 12A:
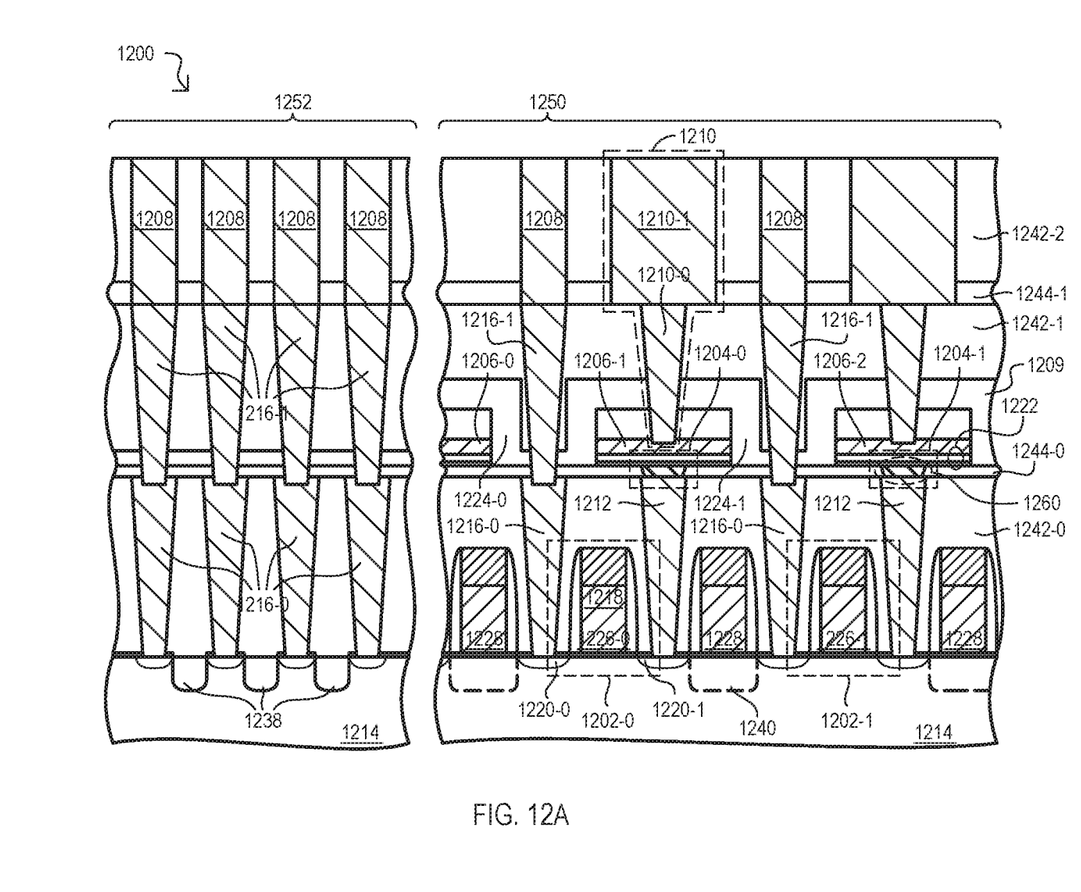
FIGS. 12A and 12B are diagrams showing an IC device according to another particular embodiment.
Figure 12B:
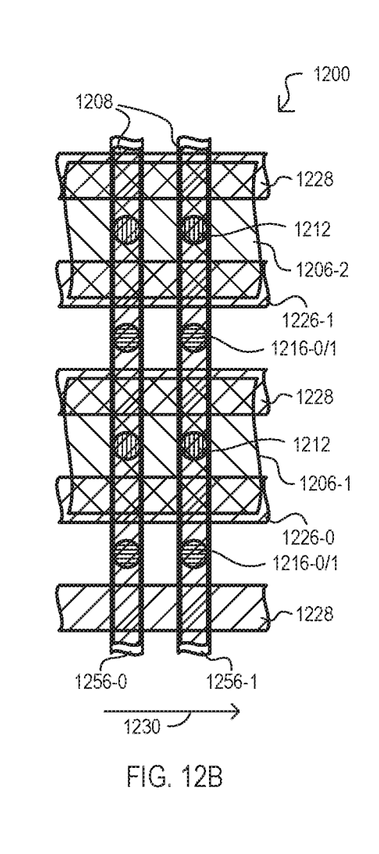

FIGS. 12A and 12B are diagrams showing an IC device 1200 according to a further particular embodiment. An IC device 1200 can have a structure like that of FIGS. 9A and 9B.

IC device 1200 can differ from that of FIGS. 9A/B in that an arrangement of word lines can include word lines 1202-0/1 that alternate with extra word lines 1228. As in other examples above, extra word lines may not be included and instead, row isolation 1240 can isolate memory cells in the bit line direction.

The embodiment of FIGS. 12A/B also differs from FIGS. 9A/B in that plate structures 1206-0/1/2 can be narrower in the bit line direction, not extending over more than two word lines.

The embodiment of FIGS. 12A/B further differs from FIGS. 9A/B in the structure of bit line contacts. While bit line contacts of IC device 1200 can include first and second bit line structures 1216-0/1, second bit line contact structures 1216-1 can take the form of a contact/via type connection, rather than a landing pad (e.g., metallization) form. In some embodiments, storage contacts 1212 and first bit line contact structures 1216-0 can be formed with the same fabrication process steps. Further, a first plate contact structure 1210-0 and second bit line contact structures 1216-1 can be formed with the same fabrication process steps.

In the embodiment of FIGS. 12A/B, a modified contact surface 1260 can be provided on the tops of storage contacts 1212, and can take the form of any that described for 1060 in FIG. 11A.

It is understood that a plate tap structure 1210 may not necessarily be aligned with second bit line contact structures 1208, and can be offset, as in the case of FIG. 9B, or positioned at a distal end, as in the case of FIG. 11A.

While FIG. 12A does not include a cross sectional view of a non-array region (e.g., periphery), it is understood an IC device 1200 can include a non-array region as shown in other embodiments, or equivalents.

In FIG. 12A, storage contacts 1212 and first bit line contact structures 1216-0 can be formed through, and plate structures (1206-0/1/2) can be formed on, a first insulation layer 1242-0. A second insulation layer 1242-1 can be formed over first insulation layer 1242-0. Second bit line contact structures 1216-1 and a first plate contact structure 1210-0 can extend through second insulation layer 1242-1. A third insulation layer 1242-2 can be formed over second insulation layer 1242-1. Bit lines 1208 and second plate contact structures 1210-1 extend through third insulation layer 1242-2 to contact second bit line contact structures 1216-1 and first plate contact structure 1210-0, respectively.

FIG. 12A also shows an insulating layer 1244-0 that can be formed between first insulation layer 1242-0 and second insulation layer 1242-1. A modified contact surface 1260 can be formed within such a layer. In addition, an insulation layer 1244-1 can be formed between second insulation layer 1242-1 and third insulation layer 1242-2. In some embodiments, insulation layer 1244-1 can serve as an etch stop layer or a hard etch mask.

FIG. 12A shows bit lines 1208 in view 1252. Further, bit lines are also shown in FIG. 12B, extending a direction perpendicular to a word line direction 1230.

In one very particular embodiment, bit lines 1208 and second plate contact structures 1210-1 can be formed with a first metallization layer (M1) of an IC fabrication process. However, such an arrangement should not be construed as limiting.

It should be appreciated that reference throughout this description to one "embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
a plurality of access transistors formed in a substrate having control terminals connected to word lines that extend in a first direction;
a plurality of two-terminal programmable impedance elements formed over the substrate, each programmable impedance element programmable between at least two different impedance values;
at least one conductive plate structure formed on and having a common conductive connection to, multiple rows and columns of the programmable impedance elements, the at least one conductive plate structure extending in at least the first direction;
a plurality of storage contacts, each storage contact extending from a first current terminal of each access transistor to one of the programmable impedance elements;
a plurality of bit lines formed over the at least one conductive plate structure, the bit lines extending in a second direction different from the first direction; and
a plurality of bit line contacts that extend from a second current terminal of each access transistor through openings in the at least one conductive plate structure to one of the bit lines; wherein
the access transistors and programmable impedance elements form memory cells that each include no more than one programmable impedance element.

2. The IC device of claim 1, wherein:
the at least one conductive plate structure includes an opening corresponding to each bit line contact through which each bit line contact extends.

3. The IC device of claim 1, wherein:
the at least one conductive plate structure includes openings through which multiple bit line contacts extend.

4. The IC device of claim 1, wherein:
the at least one conductive plate structure includes a plurality of elongated plate members that extend in the first direction, the bit line contacts extending between the elongated plate members to the bit lines.

5. The IC device of claim 1, further including:
a plate tap structure having a conductive connection to the at least one conductive plate structure, and configured to apply a variable plate voltage to the at least one conductive plate structure.

6. The IC device of claim 1, wherein:
the plate tap structure includes
a plate voltage conductor formed over the at least one conductive plate structure, and
a plate tap via that extends from the at least one conductive plate structure to the plate voltage conductor.

7. The IC device of claim 1, wherein:
the programmable impedance elements include at least one memory layer that is programmable between at least two different impedance states in response to electric fields that induce an oxidation-reduction reaction in the memory layer.

8. An integrated circuit (IC) device, comprising:
a plurality of access transistors formed in a substrate having control terminals connected to word lines that extend in a first direction;
a plurality of two-terminal programmable impedance elements formed over the substrate arranged into groups, each programmable impedance element programmable between at least two different impedance values;
a plurality of conductive plate structures, each formed on and having a common conductive connection to a different group of the programmable impedance elements, each group comprising multiple rows and columns of programmable impedance elements, each conductive plate structure extending in at least the first direction;
a plurality of storage contacts, each storage contact extending from a first current terminal of each access transistor to one of the programmable impedance elements;
a plurality of bit lines formed over the conductive plate structures, the bit lines extending in a second direction different from the first direction; and
a plurality of bit line contacts that extend from a second current terminal of each access transistor through openings in the conductive plate structures to one of the bit lines; wherein
the access transistors and programmable impedance elements form memory cells that each include no more than one impedance element.

9. The IC device of claim 8, wherein:
each storage contact includes at least a first type contact structure extending vertically from the substrate; and
each bit line contact includes at least a second type contact structure terminating at a greater vertical distance from the substrate than the first type contact structures.

10. The IC device of claim 9, further including:
a plate tap structure having a conductive connection to at least one of the conductive plate structures that includes
a plate voltage conductor formed over the at least one conductive plate structure, and
a plate tap via that extends from the at least one conductive plate structure to the plate voltage conductor, the plate tap via terminating above the substrate at a same distance as the second type contact structures.

11. The IC device of claim 8, wherein:
each storage contact includes at least a first type contact structure extending vertically from the substrate; and
each bit line contact includes at least the first type contact structure.

12. The IC device of claim 11, wherein:
each bit line contact further includes at least a second type contact structure extending vertically from the corresponding first type contact structure.

13. The IC device of claim 1, further including:
a plate tap structure patterned from a metallization layer formed above the conductive plate structures and having a conductive connection to at least one of the conductive plate structures.

14. The IC device of claim 8, wherein:
the programmable impedance elements include at least one memory layer that is programmable between at least two different impedance states in response to electric fields including by an oxidation-reduction reaction in the memory layer.

15. An integrated circuit (IC) device, comprising:
a plurality of bit lines extending in a first direction;
at least one conductive plate structure formed between the bit lines and a substrate and extending in a second direction different from the first direction;
a plurality of two-terminal programmable impedance elements arranged into rows and columns and having a common conductive connection to the at least one conductive plate structure, each programmable impedance element programmable between at least two different impedance values;
a plurality of access transistors formed in the substrate having control terminals connected to word lines that extend in the second direction;
a plurality of bit line contacts that each extend from one of the bit lines through an opening in the at least one conductive plate structure to a first current terminal of one of the access transistors; and
a plurality of storage contacts that each extend from one programmable impedance element to a second current terminal of one of the corresponding access transistors; and
each access transistor and its one corresponding programmable impedance element form one memory cell.

16. The IC device of claim 15, wherein:
the at least one conductive plate structure includes a plurality of plate members that extend in the second direction.

17. The IC device of claim 15, wherein:
the programmable impedance elements include at least one memory layer that is programmable between at least two different impedance states in response to electric fields including by an oxidation-reduction reaction in the memory layer.

* * * * *